United States Patent
Lu et al.

(10) Patent No.: US 12,197,733 B2
(45) Date of Patent: Jan. 14, 2025

(54) MEMORY SYSTEM REFRESH MANAGEMENT

(71) Applicant: Micron Technology, Inc., Boise, ID (US)

(72) Inventors: Yang Lu, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 17/965,957

(22) Filed: Oct. 14, 2022

(65) Prior Publication Data

US 2023/0393748 A1   Dec. 7, 2023

Related U.S. Application Data

(60) Provisional application No. 63/348,280, filed on Jun. 2, 2022.

(51) Int. Cl.
*G06F 3/06* (2006.01)

(52) U.S. Cl.
CPC .......... *G06F 3/0613* (2013.01); *G06F 3/0659* (2013.01); *G06F 3/0673* (2013.01)

(58) Field of Classification Search
CPC ..... G06F 3/0613; G06F 3/0659; G06F 3/0673
See application file for complete search history.

(56) References Cited

U.S. PATENT DOCUMENTS

| | | | |
|---|---|---|---|
| 6,526,471 B1 * | 2/2003 | Shimomura | G06F 13/1631 711/111 |
| 9,236,110 B2 | 1/2016 | Bains et al. | |
| 9,286,964 B2 | 3/2016 | Halbert et al. | |
| 9,659,626 B1 * | 5/2017 | Querbach | G11C 11/40618 |
| 9,685,240 B1 | 6/2017 | Park | |
| 2014/0016423 A1 * | 1/2014 | Ware | G11C 11/40611 365/222 |
| 2014/0059287 A1 | 2/2014 | Bains et al. | |
| 2018/0348838 A1 * | 12/2018 | Cox | G06F 1/324 |
| 2020/0043545 A1 * | 2/2020 | Gans | G11C 16/349 |
| 2020/0174882 A1 * | 6/2020 | Kim | G11C 11/40603 |
| 2022/0115057 A1 * | 4/2022 | Pope | G11C 11/40611 |
| 2023/0146377 A1 * | 5/2023 | You | G06F 3/0673 714/6.12 |
| 2023/0154518 A1 * | 5/2023 | Kim | G11C 11/40603 365/222 |

* cited by examiner

*Primary Examiner* — Ryan Bertram
(74) *Attorney, Agent, or Firm* — Brooks, Cameron & Huebsch, PLLC

(57) ABSTRACT

Systems, apparatuses, and methods related to memory system refresh management are described herein. In an example, a refresh operation can be performed on a set of memory cells in a memory device. The memory device comprising a plurality of sets of memory cells corresponding to respective portions of an array of memory cells of the memory device. The refresh operation can include receiving a mode register write command. The refresh operation can include writing mode register data associated with the mode register write command. The refresh operation can be performed on the set of memory cells at an address location indicated by the written mode register data.

20 Claims, 5 Drawing Sheets

MEMORY SYSTEM REFRESH MANAGEMENT

PRIORITY INFORMATION

This application claims the benefit of U.S. Provisional Application Ser. No. 63/348,280 filed on Jun. 2, 2022, the contents of which are incorporated herein by reference.

TECHNICAL FIELD

The present disclosure relates generally to apparatuses, systems, and methods for memory system refresh management.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Memory devices can be coupled to a host (e.g., a host computing device) to store data, commands, and/or instructions for use by the host while the computer or electronic system is operating. For example, data, commands, and/or instructions can be transferred between the host and the memory device(s) during operation of a computing or other electronic system.

DETAILED DESCRIPTION

Figure 1:
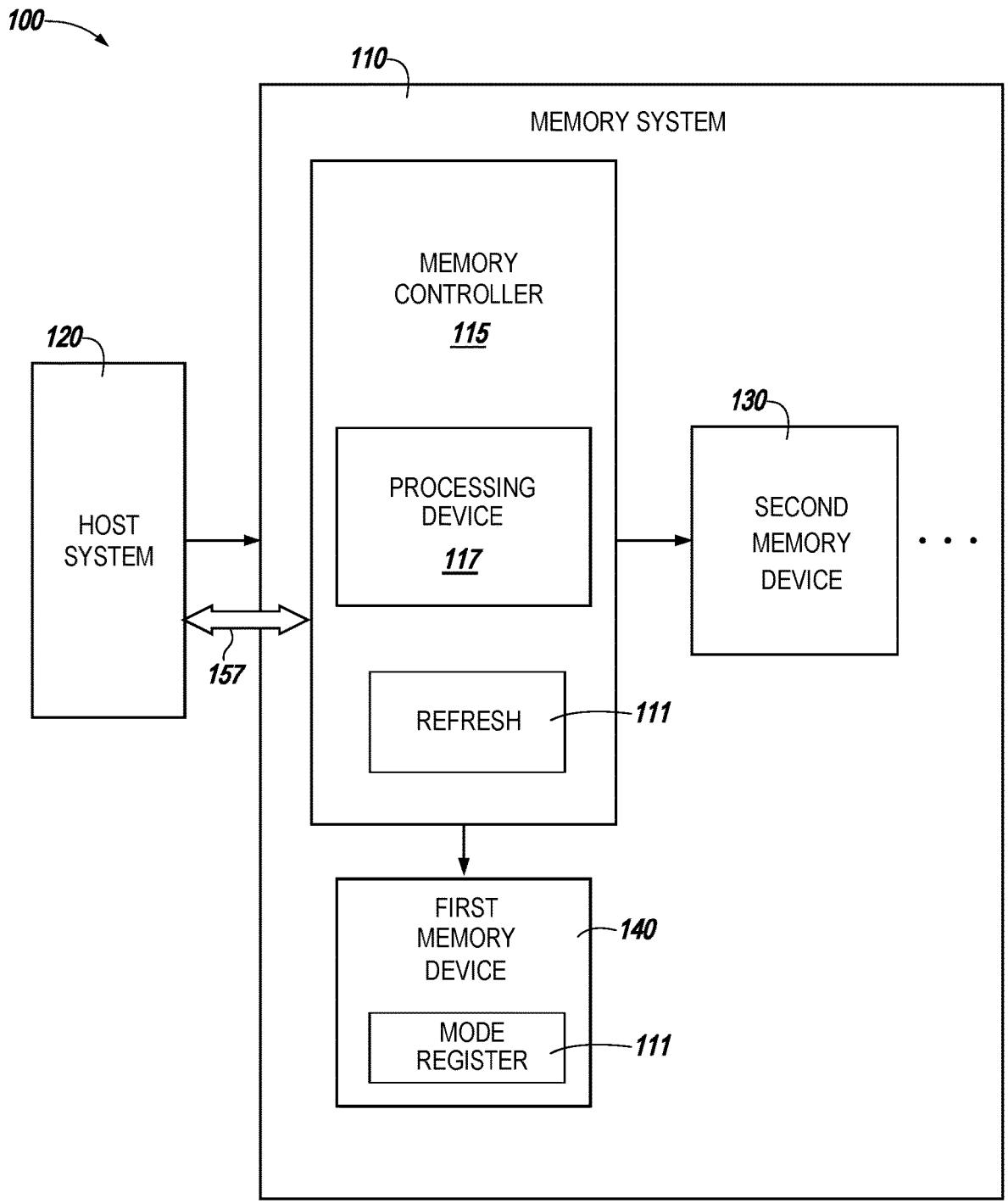
FIG. 1 illustrates an example computing system that includes a memory system in accordance with a number of embodiments of the present disclosure.

Systems, apparatuses, and methods related to a memory system for refresh management are described herein. Memory cells of a memory device can be programmed to a target (e.g., desired) data state. For instance, an electric charge can be placed on or removed from a charge storage structure (e.g., a floating gate or a replacement gate) of a memory cell in a page to program the memory cell to a particular data state (e.g., to store data). In order to increase device reliability, a refresh operation can be performed on a data pattern of a row of data stored in the memory device to refresh the data (e.g., a "0" initially stored in a memory cell can be refreshed to a "0" again and a "1" initially stored in a memory cell can be refreshed to a "1" again). Refresh operations are background operations common to DRAM memory devices. In DRAM, each data value (e.g., bit) is stored as the presence or absence of charge on a capacitor. As time passes, the charge can leak away and may be lost without refresh operations. For example, a DRAM cell may be refreshed by charging a capacitor serving as the charge storage structure for the cell to a particular voltage.

A row disturb event refers to undesirable changes in capacitor voltages of DRAM cells of a neighboring row in response to the given row being frequently accessed. As an example, a hacker may employ row disturb events to intentionally alter data stored in memory by repeatedly accessing a particular row in rapid succession. Refreshing the cells at a faster rate (e.g., more frequently) can improve the reliability of the data stored in the memory cells by canceling out the disturb data loss effects. However, an increased refresh rate involves increased power consumption. Memory devices are typically preconfigured with a predefined set of refresh control features prior to deployment of the memory device. However, future security vulnerabilities cannot always be predicted.

When performing a refresh operation, a row address for performing the refresh operation is determined and a refresh command is sent to perform the refresh operation. In some scenarios, the memory cells associated with the row address for performing the refresh operation may be open (e.g., activated) and in current use by the DRAM. In some scenarios, the memory cells associated with the row address may be idle or memory cells associated with a different row address may be open. As used herein, the term "activate," and variants thereof, refers to the act of opening a row, set, and/or page to permit a read and/or write of data to the row, set, and/or the page once opened.

In some previous approaches, a precharge operation can be performed to close the memory cells currently open followed by an activate operation on the target row of memory cells (e.g., memory cells associated with the row address for performing the refresh operation). A precharge operation on the target row of memory cells can be performed in order to sample the address row and subsequently perform the refresh operation. The timeline of this previous approach includes a time period to perform a precharge operation, an activate operation, a precharge operation, and a refresh operation, which can add additional time delays and processing resource costs. As used herein, an open page refers to a page which is operated during or just after performing a read operation or a write operation for a particular period of time. As used herein, a closed page refers to a page which is being or has been closed immediately following a read operation or a write operation. As used herein, the term "precharge" refers to the act of applying a voltage to bit lines (e.g., digit lines) coupled to the memory cells to close an open set, row, and/or page to put the set, row, and/or page in an idle state.

In order to address these and other issues associated with some previous approaches, at least one embodiment of the present disclosure provides for a shortened time period to perform the refresh operation and associated prior operations. As an example, as will be described below, a target row address can be stored in a mode register in order to avoid performing the activation operation and the precharge operation on the target row address to sample the target row address to perform the refresh operation. In order to do this, a mode register can store address locations of memory cells for performance of the refresh operation. In this way, the mode registers can be accessed and the address locations for the refresh operation can be determined. The portion of address locations can be adjusted based on which memory cells should be refreshed, based on a number of program/erases or other error relate determinations. In general, a "mode register" refers to one or more registers or configurable address spaces that store configuration information for purposes of controlling operation of a memory device.

Therefore, in the example where a different row of cells is activated, a precharge operation can be performed and a subsequent mode register write operation can be performed to write the target row address to the mode register. A subsequent refresh operation command can read the target row address from the mode register and perform the refresh operation. The time period for performing the refresh operation can include the precharge operation, at least one mode register write operation, and the refresh operation. In the example where no row of memory cells is active, the time period can exclude the precharge operation to close a row and perform the mode register write command and the refresh operation. The time period for performing the refresh operation in this instance is shorter than the time period to perform the refresh operation in accordance with previous approaches.

The memory cells are part of a memory system (such as the memory system 110 in FIG. 1). In some embodiments, the memory system can be a Compute Express Link (CXL) compliant memory system (e.g., the memory system can include a PCIe/CXL interface). CXL is a high-speed central processing unit (CPU)-to-device and CPU-to-memory interconnect designed to accelerate next-generation data center performance. CXL technology maintains memory coherency between the CPU memory space and memory on attached devices, which allows resource sharing for higher performance, reduced software stack complexity, and lower overall system cost.

CXL is designed to be an industry open standard interface for high-speed communications, as accelerators are increasingly used to complement CPUs in support of emerging applications such as artificial intelligence and machine learning. CXL technology is built on the peripheral component interconnect express (PCIe) infrastructure, leveraging PCIe physical and electrical interfaces to provide advanced protocol in areas such as input/output (I/O) protocol, memory protocol (e.g., initially allowing a host to share memory with an accelerator), and coherency interface. In some embodiments, the CXL technology can include a plurality of I/O lanes configured to transfer the plurality of commands to or from circuitry external to the memory controller at a rate of around thirty-two (32) giga-transfers per second. In another embodiments, the CXL technology can comprise a peripheral component interconnect express (PCIe) 5.0 interface coupled to a plurality of I/O lanes, wherein the memory controller is to receive commands involving at least one of a memory device, a second memory device, or any combination thereof, via the PCIe 5.0 interface according to a compute express link memory system.

In the following detailed description of the present disclosure, reference is made to the accompanying drawings that form a part hereof, and in which is shown by way of illustration how one or more embodiments of the disclosure can be practiced. These embodiments are described in sufficient detail to enable those of ordinary skill in the art to practice the embodiments of this disclosure, and it is to be understood that other embodiments can be utilized and that process, electrical, and structural changes can be made without departing from the scope of the present disclosure.

As used herein, a "set of memory cells" or "set" refers to a physical arrangement of memory cells such as a row of memory cells or a portion of a row of memory cells, among other possible configurations of memory cells. As used herein, a "row of memory cells" or "row" refers to an arrangement of memory cells that can be activated together (e.g., via access lines). Each row can include a number of pages. As used herein, the term "page" and "pages of memory cells" can be interchangeably used. As used herein, a "page" refers to a unit of programming and/or sensing (e.g., a number of memory cells that are programmed and/or sensed together as a functional group). In some embodiments each row (or a subset of a row) can comprises one page of memory cells.

As used herein, designators such as "M," "R," "J," "S," "U," etc., for example, particularly with respect to reference numerals in the drawings, indicate that a number of the particular feature can be included. It is also to be understood that the terminology used herein is for the purpose of describing particular embodiments only and is not intended to be limiting. As used herein, the singular forms "a," "an," and "the" can include both singular and plural referents, unless the context clearly dictates otherwise. In addition, "a number of," "at least one," and "one or more" (e.g., a number of sound devices) can refer to one or more sound devices, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled," and "coupling" mean to be directly or indirectly connected physically or for access to and movement (transmission) of commands and/or data, as appropriate to the context.

The figures herein follow a numbering convention in which the first digit or digits correspond to the figure number and the remaining digits identify an element or component in the figure. Similar elements or components between different figures can be identified by the use of similar digits. A group or plurality of similar elements or components can generally be referred to herein with a single element number. For example, a plurality of reference elements 203-0, . . . 203-M (e.g., 203-0 to 203-M) can be referred to generally as 203. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 illustrates an example computing system 100 that includes a memory system 110 in accordance with a number of embodiments of the present disclosure. As used herein, an "apparatus" can refer to, but is not limited to, any of a variety of structures or combinations of structures, such as a circuit or circuitry, a die or dice, a module or modules, a device or devices, or a system or systems, for example. In some embodiments, the computing system 100 can include a memory system 110 including a memory controller 115 and memory devices 130, 140. The computing system 100 can be coupled to a host system 120.

In some embodiments, the memory controller 115 can be configured to manage a DRAM memory device. The memory devices 130, 140 can provide main memory for the computing system 100 or could be used as additional memory or storage throughout the computing system 100. In some embodiments, the memory devices 130, 140 can be a ferroelectric field-effect transistor (FeFET) memory device. In another embodiment, the memory devices 130, 140 can be a dynamic random-access memory (DRAM), ferroelectric random-access memory (FeRAM), or a resistive random-access memory (ReRAM) device, or any combination thereof. The memory devices 130, 140 can include one or more arrays of memory cells, e.g., volatile and/or non-volatile memory cells. In various embodiments, the memory devices 130, 140 can include at least one array of volatile memory cells. Embodiments are not limited to a particular type of memory device. For instance, the memory devices can include RAM, ROM, DRAM, SDRAM, PCRAM, RRAM, and flash memory, among others. Although shown as two memory devices 130, 140, it will be appreciated that a single memory device or three or more memory devices, are contemplated within the scope of the disclosure.

As described herein, the memory device 140 (and in some embodiments the memory device 130, although not illustrated) includes a mode register 111 that stores address locations of memory cells. The address locations can correspond to memory cells for performing a refresh operation on. For instance, it may be beneficial to store an address location of a row of memory cells to perform the refresh operation on in order to avoid having to sample the address location during a precharge operation.

A memory system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory systems 110. In some embodiments, the host system 120 is coupled to different types of memory system 110. The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory system 110, for example, to perform a command. As used herein, the term "command" refers to an instruction from a memory system to perform a task or function. For example, the memory controller 115 of the memory system 110 can cause a processing device 117 to perform a task based on a given command. In some embodiment, a command can include a memory request. That is, a command can be a request to read and/or write data from and/or to the memory device (e.g., second memory device 130 and/or first memory device 140). The host system 120 may, for example, write data to the memory system 110 and read data from the memory system 110 based on a command (e.g., memory request).

The host system 120 can be coupled to the memory system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory system 110. The host system 120 can further utilize an NVM Express (NVMe) interface to access components (e.g., memory devices 130, 140) when the memory system 110 is coupled with the host system 120 by the PCIe interface. The physical host interface can provide an interface for passing control, address, data, and other signals between the memory system 110 and the host system 120. In general, the host system 120 can access multiple memory systems via a same communication connection, multiple separate communication connections, and/or a combination of communication connections.

In various embodiments, the memory controller 115 may generate status information, which may be transferred to or from host system 120, for example via the sideband channel 157. The sideband channel 157 may be independent of (e.g., separate from) a double data rate (DDR) memory interface and/or a non-volatile memory express (NVMe) interface that may be used to transfer (e.g., pass) DDR commands and/or NVM commands between the host system 120 and the memory device 110. That is, in some embodiments, the sideband channel 157 may be used to transfer commands to cause performance of bit vector operations from the host system 120 to the memory device 110 while a control bus (not illustrated) is used to transfer DRAM commands and/or NVM commands from the host system 120 to the memory device 110. The memory devices 130, 140 can include any combination of the different types of non-volatile memory devices and/or volatile memory devices. Examples of volatile memory devices can be, but are not limited to, random access memory (RAM), such as dynamic random-access memory (DRAM) and synchronous dynamic random-access memory (SDRAM).

Some examples of non-volatile memory devices can include, but are not limited to, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130, 140 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130, 140 can be grouped as pages that can refer to a logical unit of the memory device used to store data. In some embodiments, pages of memory cells can be comprised of one or more rows of memory cells. In addition, a row of memory cells can be comprised of one or more sets of memory cells.

The memory controller 115 (or controller 115 for simplicity) can communicate with the memory devices 130, 140 to perform operations such as reading data, writing data, or erasing data at the memory devices 130, 140 and other such operations. The memory controller 115 can include hardware such as one or more integrated circuits and/or discrete components, a buffer memory, or a combination thereof. The hardware can include digital circuitry with dedicated (i.e., hard-coded) logic to perform the operations described herein. The memory controller 115 can be a microcontroller, special purpose logic circuitry (e.g., a field programmable gate array (FPGA), an application specific integrated circuit (ASIC), etc.), or other suitable processor.

While the example memory system 110 has been illustrated in FIG. 1 as including the memory controller 115, in another embodiment of the present disclosure, a memory system 110 does not include a memory controller 115, and can instead rely upon external control (e.g., provided by an external host, or by a processor or controller separate from the memory system).

In general, the memory controller 115 can receive commands or operations from the host system 120 and can convert the commands or operations into instructions or appropriate commands to achieve the desired access to the memory device 130 and/or the memory device 140. The memory controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address (PBA), physical media locations, etc.) that are associated with the memory devices 130, 140. The memory controller 115 can further include host interface circuitry to communicate with the host system 120 via the physical host interface. The host interface circuitry can convert the commands received from the host system into command instructions to access the second memory device 130 and/or the first memory device 140 as well as convert responses associated with the second memory device 130 and/or the first memory device 140 into information for the host system 120.

The memory system 110 can also include additional circuitry or components that are not illustrated. In some embodiments, the memory system 110 can include a cache or buffer (e.g., DRAM) and address circuitry (e.g., a row decoder and a column decoder) that can receive an address from the memory controller 115 and decode the address to access the second memory device 130 and/or the first memory device 140.

As discussed herein, the memory system 110 (and/or constituent components thereof, such as memory cells of the first memory device 140 and/or memory cells of the second memory device 130, etc.) can experience charge leakage and/or parasitic currents due to repeated access of a set of memory cells. In some instances, charge leakage and/or parasitic currents can cause data corruption in a page associated with the set of memory cells and/or cause the page associated with the set of memory cells to wear-out. In some embodiments, the memory controller 115 can detect and mitigate errors in data due to charge leakage and/or parasitic currents using an error detection operation and/or monitoring a quantity of accesses (e.g., programs/erases, etc.) of the memory cells. A refresh operation can be performed on memory cells whose parameters exceed a threshold parameter (e.g., whose quantity of accesses exceed a threshold quantity of accesses, whose quantity of errors exceeds a quantity of errors, etc.).

For example, in some embodiments, the memory controller 115 can receive an indication that a parameter of a set of memory cells (e.g., a row of memory cells) has reached a threshold. In response, the memory controller 115 can cause a refresh operation to be performed on the set of memory cells. To perform the refresh operation, the memory controller 115 can send a command to precharge an additional set of memory cells that may be open or active to deactivate the additional set of memory cells. The memory controller 115 can store an address location associated with the set of memory cells to perform the refresh operation in a mode register 111. When sending a refresh command, the mode register 111 can be accessed in order to determine which set of memory cells associated with the address location stored in the mode register 111 to perform the refresh operation. The memory controller 115 can send the command to perform the refresh operation and the mode register 111 can be accessed. Using the address location from the mode register, the refresh operation can be performed on the set of memory cells at the address location.

Figure 2:
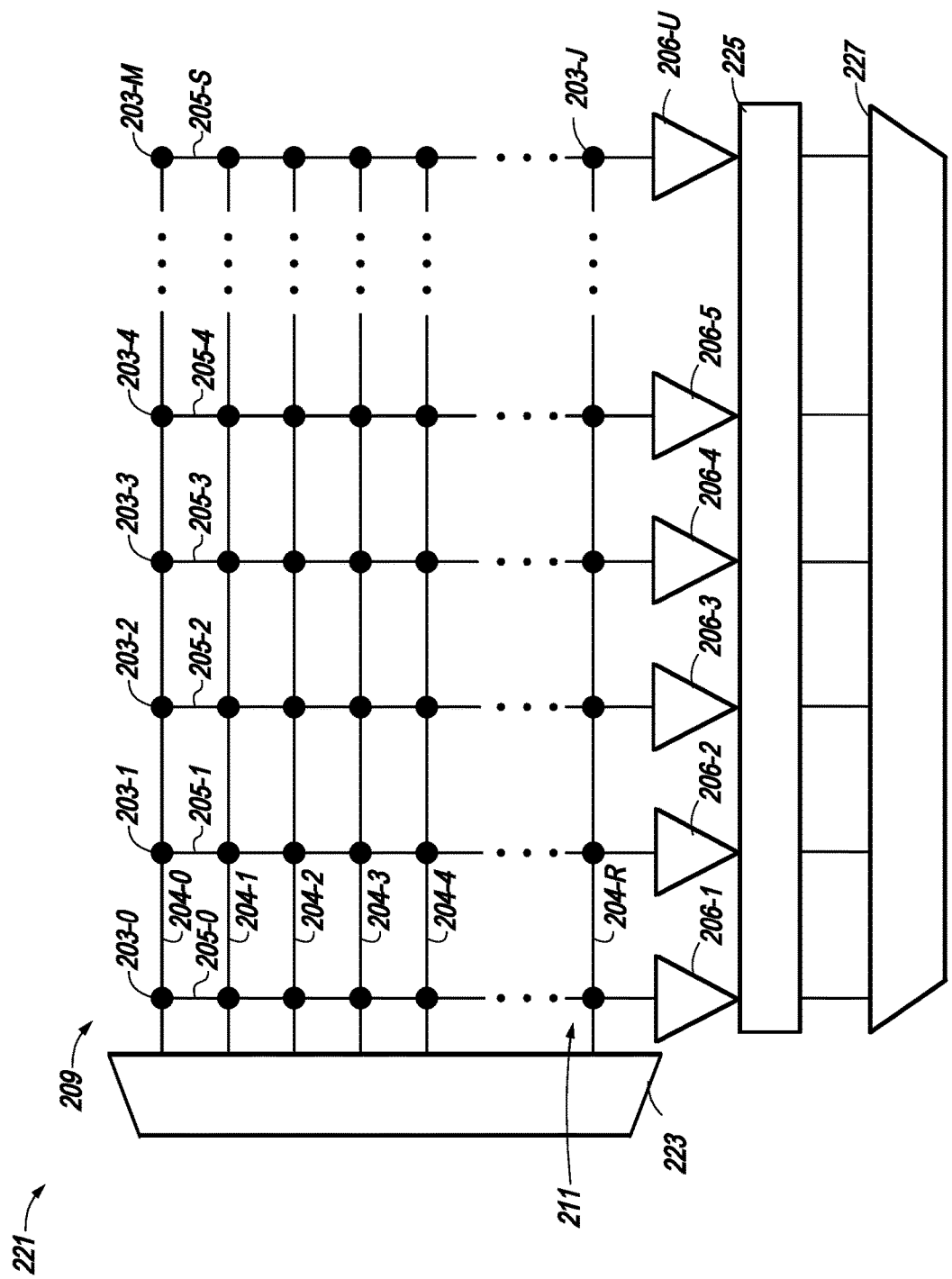
FIG. 2 illustrates an example functional diagram that includes memory cells arranged in rows in accordance with a number of embodiments of the present disclosure.

FIG. 2 illustrates an example functional diagram 221 that includes memory cells arranged in rows in accordance with a number of embodiments of the present disclosure. The functional diagram 221 can be used in connection with the computer system (e.g., the computer system 100 of FIG. 1). The components illustrates in the functional diagram 221 can be within a number of memory devices (e.g., the memory devices 130, 140 in FIG. 1). The functional diagram can include an array 209 of memory cells 203-0 to 203-M, a row decoder 223, a row buffer 225, a plurality of sense amplifiers 206-1 to 206-U, and a multiplexer 227.

The array 209 includes memory cells (referred to generally as memory cells 203, and more specifically as memory cells 203-0 to 203-M and/or to 203-J) coupled to rows of access lines 204-0, 204-1, 204-2, 204-3, 204-4, . . . , 204-R (referred to generally as access lines 204) and columns of sense lines 205-205-1, 205-2, 205-3, 205-4, . . . , 205-S (referred to generally as sense lines 205). In some embodiments, one or more mode registers 211 (e.g., similar to mode registers 111 in FIG. 1) can be part of row 204-R in the array 209 and/or in additional rows of the array 209. Further, the array 209 of memory cells is not limited to a particular number of access lines and/or sense lines, and use of the terms "rows" and "columns" does not intend a particular physical structure and/or orientation of the access lines and/or sense lines. Although not pictured, each column of memory cells can be associated with a corresponding pair of complementary sense lines.

Each column of memory cells can be coupled to a number of respective sense amplifiers 206-1, 206-2, 206-3, 206-4, 206-5, . . . , 206-U coupled to the respective sense lines 205-0, 205-1, 205-2, 205-3, 205-4, . . . , 205-S. Each of the respective sense amplifiers 206 are coupled to a row buffer 225 used to store the data accessed from the memory cells 203. As an example, the memory cells 203 can be selectively activated through decode lines to transfer data sensed by respective sense amplifiers 206-0 to 206-U to the row buffer 225.

In some embodiments, a memory controller (such as the memory controller 115 in FIG. 1) can receive a first command and initiate a first activation on a first row of cells coupled to access line 204-0). The activation of the first row of cells can initiate a memory access of one or more memory devices. As used herein, activation of a row can include activation of all the rows or an activation of a subset of the rows. For instance, activation of a row can include activating all transistors of each cell 203-0 to 203-M in a row or can include activating some but not all transistors on a row (a subset of cells 203-0 to 203-M). Activation of a row (or similarly activation of a subset of a row) can permit information to be stored on or accessed from the row.

In some embodiments, as illustrated in FIG. 2, a multiplexer 227 can be used to select particular data in the row buffer 225 that corresponds to a column of cells. As an example, a row address can be input to the row decoder 223 to indicate which row to access and a column address can be input to the multiplexer 227 to indicate which data associated with a column in the row buffer 225 to select so that particular data from a particular cell can be selected. The selected data can be transferred out via the multiplexer 227. For example, the memory controller can alter the logic state (e.g., switch the logic state from a "1" to a "0"). However, as used herein logic states are not limited to "1" or "0" and can include other values/types of logic states.

Figure 3:
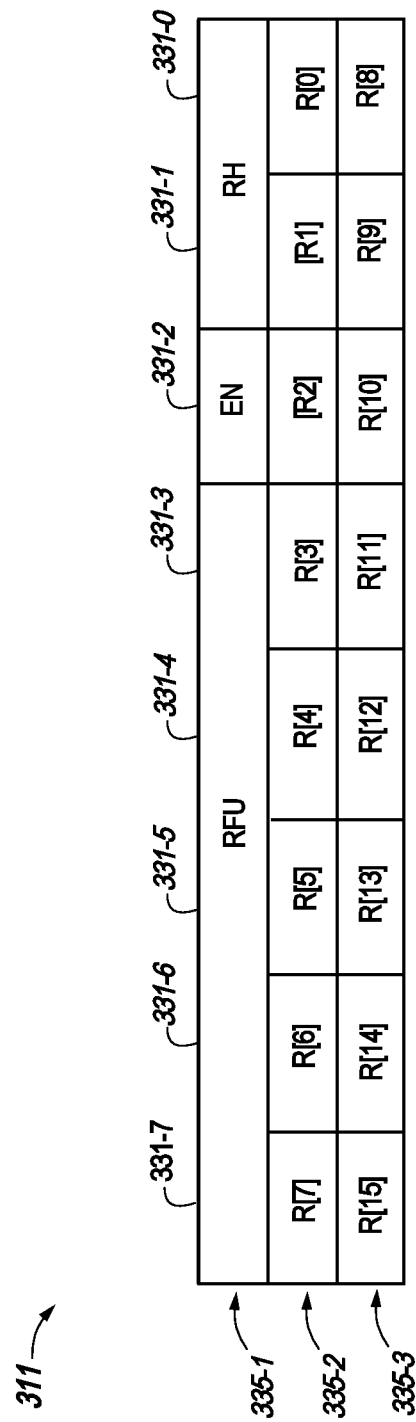
FIG. 3 is an example block diagram of mode registers used to perform a refresh operation in accordance with a number of embodiments of the present disclosure.

FIG. 3 is an example block diagram of mode registers 311 used to perform a refresh operation in accordance with a number of embodiments of the present disclosure. The mode register 311 can be similar to mode registers 111 and 211 in FIGS. 1 and 2, respectively. The mode registers 311 can include a number of rows 335-1, 335-2, 335-3 (hereinafter referred to collectively as number of rows 335) of mode registers 311. The mode registers 311 can include a number of columns 331-7 to 331-0 (hereinafter referred to collectively as number of columns 331) of the mode registers 311. The number of rows 335 and number of columns 331 can each store a bit corresponding to an address location. As an example, an address location can be determined based on data that is 16-bits in length. A $0^{th}$ bit ("R[0]") can be stored in a cell in column 331-0 and row 335-2. A $1^{st}$ bit ("R[1]") can be stored in a cell in column 331-1 and row 335-2. Similarly, the $2^{nd}$ through $7^{th}$ (e.g., "R[2]" through "R[7]") bits can be stored in row 335-2 and corresponding columns 331-2 to 331-7, respectively. Further, an $8^{th}$ through $15^{th}$ (e.g., "R[8]" through "R[15]") bits can be stored in row 335-3 and corresponding columns 331-0 to 331-7, respectively. In this way, the 16 bits of the example row address associated with a set of memory cells can be stored in a mode register 311.

In addition, additional data locations can be reserved for future use (e.g., "RFU") in row 335-1 and columns 331-7 to 331-3. An enable bit (e.g., "EN") can be stored in a memory cell of row 335-1 and column 331-2 and row hammer bits (e.g., "RH") can be stored in row 335-1 and columns 331-1 and 331-0. The enable bit can be used to indicate whether to enable a refresh operation. For example, a "1" bit stored in the enable bit location can indicate to perform a refresh operation and a "0" bit stored in the enable bit location can indicate to not perform a refresh operation. In response to an enable bit being a "1," a refresh operation can be performed at the row address location stored in rows 335-2 and 335-3. In response to an enable bit being a "0," a refresh operation may not be performed and the row address location stored in rows 335-2 and 335-3 would not be used for such an operation.

The row hammer ("RH") bits, in this example designated as two bits, can indicate a row hammer distance to be used for the refresh operation. As an example, in response to a particular row being accessed a threshold quantity of times, the row hammer bits can indicate whether to refresh a first neighboring row on either side of the accessed particular row and/or a first and second neighboring rows on either side of the accessed particular row. For example, if the row hammer bits are "00," a first adjacent neighboring row and a second adjacent neighboring row can be refreshed. For ease of illustration, referring to FIG. 2, if the accessed row is row 204-2, then a first adjacent neighboring row could include row 204-1 and/or row 204-3 and a second adjacent neighboring row could include row 204-0 and/or row 204-4. Therefore, if the row hammer bits are "00," then a refresh operation could occur on rows 204-0, 204-1, 204-3, and 204-4. If the row hammer bits are "01," the first adjacent neighboring row (e.g., 204-1 and/or 204-3) could receive the refresh operation. If the row hammer bits are "10," the second adjacent neighboring row (e.g., 204-0 and/or 204-4) could receive the refresh operation. In some examples, the row hammer bits equal to "11" can be reserved for a future use ("RFU"). For ease of reference, the following Table 1 indicates the row hammer bit values and corresponding operations.

TABLE 1

| RH Bit Values | Refresh Rows |
|---|---|
| 00 | RH +/− 1 and 2 |
| 01 | RH +/− 1 only |
| 10 | RH +/− 2 only |
| 11 | RFU |

Further, the refresh command itself that is sent from the memory controller to the memory device to perform the refresh operation can include the bank address bits (e.g., "BA[3:0]") that indicate which bank the row address location is located. The mode register bits that indicate the row address location can be set prior to sending the refresh command.

Figure 4:
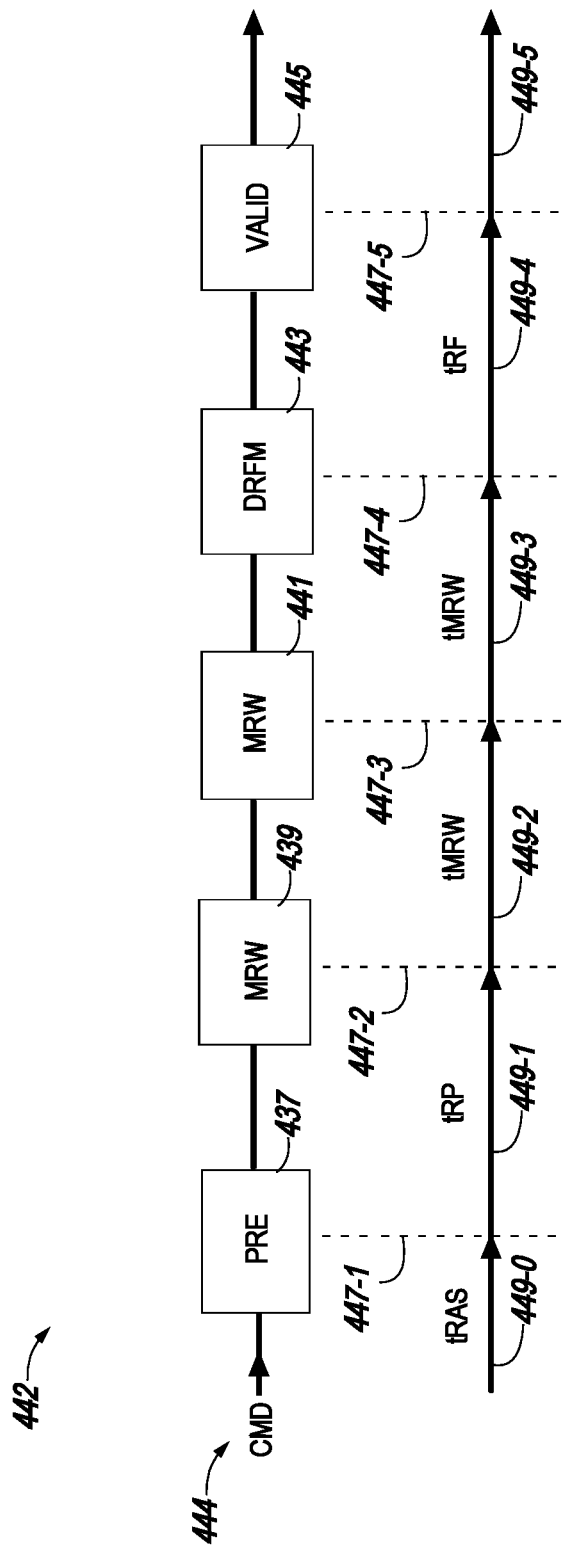
FIG. 4 is an example functional block timing diagram for using mode registers to perform a refresh operation in accordance with a number of embodiments of the present disclosure.

FIG. 4 is an example functional block timing diagram 442 for using mode registers to perform a refresh operation in accordance with a number of embodiments of the present disclosure. The timing diagram 442 illustrates a number of operations during a number of time periods. In some embodiments, a first time period 449-0 can refer to the period of time between an activation (not shown as which cells are activated is not relevant here) and a precharge operation 437 ("PRE"). The first time period 449-0 can be referred to as the restoration latency and can be referred to as "tRAS." The tRAS refers to the minimum number of cycles used between a row active command and issuing a precharge command and can include the activation, the sense amplification, and the restoration (or closing) of the memory cells. The first time period 449-0, in some examples, can be approximately 95 ns.

A second time period 449-1 between the closing of the memory cells and the next operation (e.g., mode register write, "MRW") is referred to as the row precharge time ("tRP"). In some examples, the second time period 449-1 can be between 15 to 20 nanoseconds (ns). The row precharge time can refer to the number of clock cycles taken between issuance of the precharge command 437 at time point 447-1 and the mode register write command ("MRW") at time point 447-2 (although usually this is from the issuance of the precharge command to the active command).

A third time period 449-2 can include performing a first mode register write ("MRW") operation 439 by sending a first mode register write command. In some examples, the third time period 449-2 can be approximately 10 ns. In some examples, the third time period 449-2 can be approximately between 5 to 15 ns. The first MRW operation can occur from time point 449-2 to time point 447-3 (referred to as "tMRW"). The first mode register write command can indicate to write a first row of the row address location to the mode register. For example, the first mode register write command can indicate to write bits 0 to 7 in row 335-2 of FIG. 3.

A fourth time period 449-3 can include performing a second mode register write ("MRW") operation 441 by sending a second mode register write command. In some examples, the fourth time period 449-3 can be approximately 10 ns. In some examples, the fourth time period 449-3 can be approximately between 5 to 15 ns. The second MRW operation can occur from time point 449-3 to time point 447-4 (referred to as "tMRW"). The second mode register write command can indicate to write a second row of the row address location to the mode register. For example, the second mode register write command can indicate to write bits 8 to 15 in row 335-3 of FIG. 3.

A fifth time period 449-4 can include performing a refresh operation on the set of memory cells of the row address location stored in the mode register. In some examples the fifth time period 449-4 can vary from 50 ns to 1,000 ns. The refresh operation can occur from time point 447-4 to time point 447-5 (and can be referred to as "tRFM"). Upon completion of the refresh operation, the data can be valid 445 and the final time period 449-5 can be subsequent operations performed on the set of memory cells.

In some embodiments, in response to a row hammer trigger event, a memory controller can perform a refresh operation on a target row of memory cells by beginning the above operations described in association with FIG. 4. Row hammer attacks generally refer to security exploits that take advantage of an unintended and undesirable side effect in which memory cells interact electrically between themselves by leaking their charges, possibly changing the contents of nearby memory rows that were not addressed in the original memory access. A row hammer trigger event can refer to the occurrence of this row hammer attack occurring and/or can refer to a particular threshold of charge leak that may occur and use a refresh to correct or rectify.

The refresh operation protocol can include, if a row is currently active, the memory controller issuing a precharge command, two mode register write commands, and a refresh command to complete the sequence. The latency of this refresh operation is equal to Max (tRP, 2+tMRW)+tRFM. The refresh protocol can include, if no row of memory cells is currently active, the memory controller issuing the two mode register write commands and the refresh operation. The latency of this example can be equal to 2+tMRW+tRFM.

In some examples, when using a low power density memory system, for a 2 pump (or dual pump) refresh operation, the total sequencing time can be approximately 220 nanoseconds (ns), approximately 55% of the Jedec standard refresh timing and includes only spending 50% of the power due to less active-precharge operations being performed. In some examples, for a 4 pump refresh operation, the total sequence timing can be approximately 420 ns, approximately 70% of the Jedec standard refresh timing and includes only spending 66% of the power due to less active-precharge operations being performed.

Figure 5:
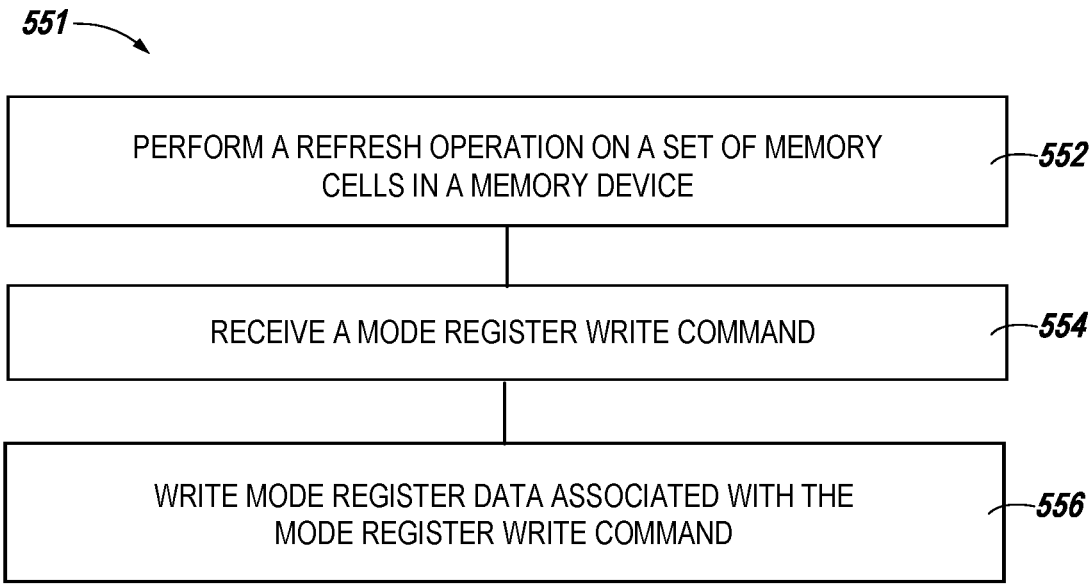
FIG. 5 illustrates a diagram representing an example method for memory system refresh management in accordance with a number of embodiments of the present disclosure.

FIG. 5 illustrates a diagram representing an example method 551 for memory system refresh management in accordance with a number of embodiments of the present disclosure. In some embodiments, a computer system (e.g., the computer system 100) can include a memory controller (e.g., the memory controller 115 of FIG. 1) and a processing device (e.g., the processing device 117 of FIG. 1). The memory controller can cause the processing device to perform the refresh operation in accordance with the description above.

At 552, the method 551 describes that the memory controller can cause performance of a refresh operation on a set of memory cells in a memory device. The memory device includes a plurality of sets of memory cells corresponding to respective portions of an array of memory cells of the memory device. The set of memory cells can correspond to a row of memory cells or a page of memory cells in the memory system. The memory controller can receive a command to perform the refresh operation. In some examples, the memory device can be a Compute Express Link (CXL) compliant memory device.

In some examples of the method 551, the refresh operation can include performing a precharge operation on a row of memory cells in response to the row of memory cells in the memory device being active. In some examples of the method 551, the refresh operation does not include performing a precharge operation on memory cells in the memory device in response no row of the memory cells being active. In some examples of the method 551, the refresh operation is performed without performing an activate operation on the set of memory cells.

At 554, the method 551 describes that a mode register write command can be received. The mode register write command can indicate to write data (e.g., a row address location associated with particular memory cells) to the mode register. In some examples, the mode register data indicates a type of refresh operation to be performed. In some examples, the type of refresh operation includes refreshing only a row hammer row of memory cells. In some examples, the type of refresh operation includes refreshing a row hammer row of memory cells and at least one adjacent row of memory cells. A row hammer row can refer to a row of memory cells that has experienced a row hammer event. In some examples, the type of refresh operation includes refreshing a row hammer row of memory cells and at least two adjacent rows of memory cells. The type of refresh operation can be determined based on a number of bits (e.g., row hammer bits, "RH") stored in the mode register.

At 556, the method 551 describes that the memory controller can cause the writing of the data (e.g., the row address location) associated with the mode register write command to the mode register. The refresh operation can be performed on the set of memory cells at an address location indicated by the data written to the mode register. In some examples, the method 551 further includes activating a set of the plurality of sets of memory cells and reading the set of memory cells subsequent to activating the set of memory cells and prior to pre-charging the set of memory cells.

Figure 6:
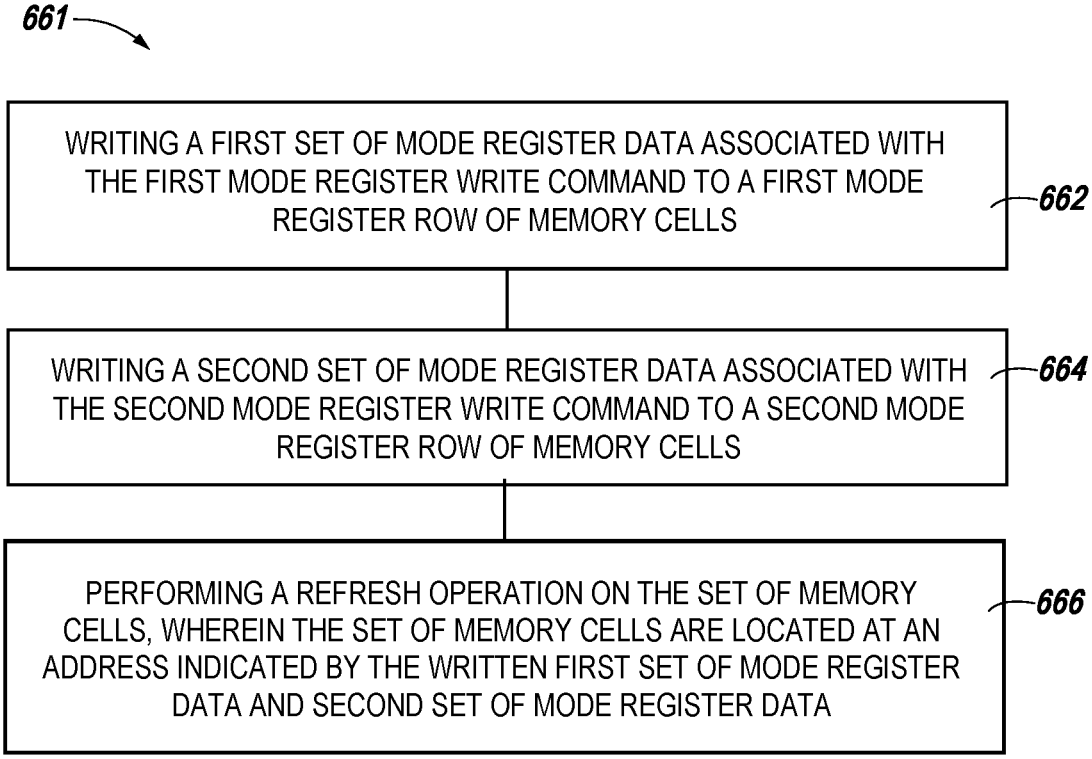
FIG. 6 illustrates a diagram representing an example method for memory system refresh management in accordance with a number of embodiments of the present disclosure.

FIG. 6 illustrates a diagram representing an example method 661 for memory system refresh management in accordance with a number of embodiments of the present disclosure. In some embodiments, a computer system (e.g., the computer system 100) can include a memory controller (e.g., the memory controller 115 of FIG. 1) and a processing device (e.g., the processing device 117 of FIG. 1). The memory controller can cause the processing device to perform the refresh operation in accordance with the description above.

At 662, the method 661 describes that the memory controller can cause writing of a first set of mode register data associated with a first mode register write command to a first mode register row of memory cells of a memory device. The memory device includes a plurality of sets of memory cells corresponding to respective portions of an array of memory cells of the memory device. The row of memory cells can correspond to a row of memory cells or a page of memory cells in the memory system. The memory controller can receive a command to perform the writing of the first set of mode register data. In some examples, the memory device can be a Compute Express Link (CXL) compliant memory device. The first mode register write command can indicate to write the first set of mode register data to the first mode register row.

At 664, the method 661 describes that the memory controller can cause writing of a second set of mode register data associated with a second mode register write command to a second mode register row of memory cells of a memory device. The memory device includes a plurality of sets of memory cells corresponding to respective portions of an array of memory cells of the memory device. The second row of memory cells can correspond to a row of memory cells or a page of memory cells in the memory system. The memory controller can receive a command to perform the writing of the second set of mode register data. The second mode register write command can indicate to write the second set of mode register data to the second mode register row.

At 666, the method 661 describes that the memory controller can cause a refresh operation to be performed on the set of memory cells. The set of memory cells can be located at an address indicated by the written first set of mode register data and the second set of mode register data. In some examples, the method 661 further includes activating a set of the plurality of sets of memory cells and reading the set of memory cells subsequent to activating the set of memory cells and prior to pre-charging the set of memory cells.

In some examples of the method 661, the refresh operation can include performing a precharge operation on a row of memory cells in response to the row of memory cells in the memory device being active. In some examples of the method 661, the refresh operation does not include performing a precharge operation on memory cells in the memory device in response no row of the memory cells being active. In some examples of the method 651, the refresh operation is performed without performing an activate operation on the set of memory cells.

Although specific embodiments have been illustrated and as described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
performing a refresh operation on a set of memory cells in a memory device, the memory device comprising a plurality of sets of memory cells corresponding to respective portions of an array of memory cells of the memory device, wherein performing the refresh operation comprises:
receiving a mode register write command; and
writing mode register data associated with the mode register write command, wherein the mode register data includes a plurality of row hammer bits indicating a row hammer distance to be used for the refresh operation; and
wherein the refresh operation is performed on the set of memory cells at an address location indicated by the written mode register data.

2. The method of claim 1, wherein the refresh operation further comprises performing a precharge operation on a row of memory cells in response to the row of memory cells in the memory device being active.

3. The method of claim 1, wherein the refresh operation does not include performing a precharge operation on memory cells in the memory device in response to no rows of the memory cells being active.

4. The method of claim 1, wherein the refresh operation is performed without performing an activate operation on the set of memory cells.

5. The method of claim 1, wherein the mode register data indicates a type of refresh operation to be performed, based on a number of the plurality of row hammer bits in the mode register data.

6. The method of claim 5, wherein the type of refresh operation comprises refreshing only a row hammer row of memory cells.

7. The method of claim 5, wherein the type of refresh operation comprises refreshing a row hammer row of memory cells and at least one adjacent row of memory cells.

8. The method of claim 5, wherein the type of refresh operation comprises refreshing a row hammer row of memory cells and at least two adjacent rows of memory cells.

9. The method of claim 1, further comprising:
activating a set of the plurality of sets of memory cells; and
reading the set of memory cells subsequent to activating the set of memory cells and prior to pre-charging the set of memory cells.

10. An apparatus, comprising:
an array of memory cells of a memory device, the array of memory cells comprising a first mode register row of memory cells, a second mode register row of memory cells, and a third mode register row of memory cells; and
a memory controller coupled to the array of memory cells, the memory controller configured to:
perform an error detection operation for a set of memory cells of the array of memory cells; and
cause, responsive to receiving, based on the error detection operation, an indication that a parameter of the set of memory cells of the array of memory cells exceeds a threshold quantity of errors, performance of a refresh operation comprising:
writing a first set of mode register data associated with a first mode register write command to the first mode register row of memory cells;
writing a second set of mode register data associated with a second mode register write command to the second mode register row of memory cells;
writing a plurality of row hammer bits indicating a row hammer distance to be used for the refresh operation to the third mode register row of memory cells; and
performing the refresh operation on the set of memory cells, wherein the set of memory cells are located at an address indicated by the written first set of mode register data and second set of mode register data.

11. The apparatus of claim 10, wherein the memory controller is further configured to receive a first mode register write command prior to writing the first set of mode register data.

12. The apparatus of claim 10, wherein the memory controller is further configured to receive a second mode register write command prior to writing the second mode register data.

13. The apparatus of claim 12, wherein the memory controller is further configured to perform the refresh operation without performing a precharge operation to sample an address of the set of memory cells on a bus.

14. The apparatus of claim 10, wherein the memory controller is further configured to read the first set of mode register data to determine whether to perform the refresh operation.

15. The apparatus of claim 10, wherein the memory controller is further configured to:
read the first set of mode register data to determine a type of refresh operation to perform.

16. The apparatus of claim 10, wherein the memory controller is further configured to read the second set of mode register data to determine an address of the set of memory cells.

17. A memory device, comprising:
a memory array comprising a plurality of memory cells; and
a memory controller coupled to the memory array, the memory controller to:
receive a mode register write command;
write a set of mode register data associated with the mode register write command to a mode register row of memory cells in response to receiving the mode register write command, the set of mode register data including a plurality of row hammer bits indicating a row hammer distance to be used for a refresh operation; and
perform the refresh operation on a set of memory cells of the plurality of memory cells, wherein the set of memory cells are located at an address indicated by the set of mode register data.

18. The memory device of claim 17, wherein a first portion of the set of mode register data indicates:
whether to perform the refresh operation; and
which type of refresh operation to perform.

19. The memory device of claim 18, wherein;
a second portion of the set of mode register data indicates the address.

20. The memory device of claim 17, wherein the plurality of row hammer bits comprise two row hammer bits, wherein:
row hammer bits of "00," indicate refreshing a first adjacent row of memory cells and a second adjacent row of memory cells of an accessed row of memory cells;
row hammer bits of "01," indicate refreshing the first adjacent row of memory cells of the accessed row of memory cells;
row hammer bits of "10," indicate refreshing the second adjacent row of memory cells of the accessed row of memory cells; and
row hammer bits of "11," indicate row hammer bits reserved for a future use.

* * * * *